United States Patent
Magalhães Mendes et al.

(10) Patent No.: US 11,427,505 B2
(45) Date of Patent: Aug. 30, 2022

(54) LASER-ASSISTED HERMETIC ENCAPSULATION PROCESS AND PRODUCT THEREOF

(71) Applicant: EFACEC ENGENHARIA E SISTEMAS, S.A., Guardeiras (PT)

(72) Inventors: Adélio Miguel Magalhães Mendes, Oporto (PT); Joaquim Gabriel Magalhães Mendes, Oporto (PT); Luísa Manuela Madureira Andrade, Oporto (PT); Seyedali Emami, Oporto (PT); Jorge Filipe Santos Martins, Salvador do Campo (PT); Jorge Miguel Dos Santos Pinto, Oliveira de Azeméis (PT)

(73) Assignee: EFACEC ENGENHARIA E SISTEMAS, S.A., Guardeiras (PT)

( * ) Notice: Subject to any disclaimer, the term of this patent is extended or adjusted under 35 U.S.C. 154(b) by 46 days.

(21) Appl. No.: 16/313,374

(22) PCT Filed: Jun. 26, 2017

(86) PCT No.: PCT/IB2017/053808
§ 371 (c)(1),
(2) Date: Dec. 26, 2018

(87) PCT Pub. No.: WO2017/221218
PCT Pub. Date: Dec. 28, 2017

(65) Prior Publication Data
US 2021/0230060 A1     Jul. 29, 2021

(30) Foreign Application Priority Data

Jun. 25, 2016 (PT) .......................................... 109489
Jan. 2, 2017 (PT) .......................................... 109826

(51) Int. Cl.
    *C03C 27/06*     (2006.01)
    *C03C 27/04*     (2006.01)
    (Continued)

(52) U.S. Cl.
    CPC ............ *C03C 27/06* (2013.01); *C03C 27/046* (2013.01); *H01L 21/56* (2013.01); *H01L 51/5246* (2013.01)

(58) Field of Classification Search
    CPC ........ C03C 27/06; C03C 27/046; H01L 21/56
    (Continued)

(56) References Cited

U.S. PATENT DOCUMENTS 6,998,776 B2 *    2/2006   Aitken .................... C03C 3/072
                                                                 313/512
8,445,468 B2      5/2013   DeLuca et al.
(Continued)

FOREIGN PATENT DOCUMENTS

EP         2 808 915 A1     12/2014
WO      2012127443 A2     9/2012

OTHER PUBLICATIONS

H. Kuisma, Chapter Thirty—Introduction to Encapsulation of MEMS, in: V. Lindroos, M. Tilli, A. Lehto, T. Motooka (Eds.), Handbook of Silicon Based MEMS Materials and Technologies, William Andrew Publishing, Boston, 2010, pp. 501-504.
(Continued)

*Primary Examiner* — Christopher M Raabe
(74) *Attorney, Agent, or Firm* — Leason Ellis LLP (57) ABSTRACT

Electronic device encapsulation process, assisted by a laser, for obtaining a sealed electronic device, wherein said process comprises: providing a first substrate and a second substrate, the second substrate being transparent in the emission wavelength of the laser, depositing an intermediate bonding contour layer on one or both of the substrates;
(Continued)

depositing electronic device components on one or both of the substrates; joining the first substrate and second substrate with the electronic device components in-between the substrates; using the laser to direct a laser beam onto the intermediate bonding contour layer with a predefined progressive scan pattern, such that the intermediate bonding contour layer is progressively melted and forms a seal, bonding the substrates together. Preferably, each linear laser pass overlaps longitudinally the previous and the following linear laser passes along said contour. Preferably, each linear laser pass is followed by a partial backtrack of the each linear laser pass, such that a part of the linear laser pass overlaps longitudinally the previous linear laser pass.

18 Claims, 7 Drawing Sheets

(51) Int. Cl.
  *H01L 21/56* (2006.01)
  *H01L 51/52* (2006.01)
(58) Field of Classification Search
  USPC .......................................... 438/127
  See application file for complete search history.

(56) References Cited

U.S. PATENT DOCUMENTS

| | | | | |
|---|---|---|---|---|
| 9,511,539 | B2* | 12/2016 | Lee | .......................... C03C 27/00 |
| 2007/0128965 | A1* | 6/2007 | Burt | .................... H01L 51/5246 |
| | | | | 445/25 |
| 2007/0128967 | A1* | 6/2007 | Becken | ................ H01L 51/5246 |
| | | | | 445/25 |
| 2009/0308105 | A1 | 12/2009 | Pastel | |
| 2010/0126898 | A1* | 5/2010 | Becken | .................... H01L 21/50 |
| | | | | 206/524.1 |
| 2011/0177746 | A1 | 7/2011 | Voronov | |
| 2012/0161305 | A1 | 6/2012 | Ruben et al. | |
| 2014/0090685 | A1 | 4/2014 | Magalhaes Mendes et al. | |
| 2014/0216645 | A1* | 8/2014 | Nakamura | .......... B32B 37/1292 |
| | | | | 156/272.8 |

OTHER PUBLICATIONS

K. Henttinena, T. Sunib, Chapter Thirty One—Silicon Direct Bonding, in: V. Lindroos, M. Tilli, A. Lehto, T. Motooka (Eds.), Handbook of Silicon Based MEMS Materials and Technologies, William Andrew Publishing, Boston, 2010, pp. 505-512.

R. Knechtel, Chapter Thirty Three—Glass Frit Bonding, in: V. Lindroos, M. Tilli, A. Lehto, T. Motooka (Eds.), Handbook of Silicon Based MEMS Materials and Technologies, William Andrew Publishing, Boston, 2010, pp. 521-531.

C.T. Pan, P.J. Cheng, M.F. Chen, C.K. Yen, Intermediate wafer level bonding and interface behavior, Microelectronics Reliability 45 (2005) 657-663.

J. Kim, B. Jeong, M. Chiao, L. Lin, Ultrasonic Bonding for MEMS Sealing and Packaging, IEEE Transactions on Advanced Packaging 32 (2009) 461-467.

Department of Defense, "Test Method Standard Microcircuits," MIL-STD-883H. Downloaded from Http://www.everyspec.com. p. 1-729 Feb. 26, 2010.

IEC61646, Thin-Film terrestrial photovoltaic (PV) modules—Design qualification and type approval, p. 1-40. 2008.

* cited by examiner

LASER-ASSISTED HERMETIC ENCAPSULATION PROCESS AND PRODUCT THEREOF

CROSS-REFERENCE TO RELATED APPLICATIONS

This application is a U.S. National Stage Application under 35 U.S.C. § 371 of International Patent Application No. PCT/IB2017/053808, filed Jun. 26, 2017, which claims priority to Portugal Application No. 109826, filed Jan. 2, 2017 and Portugal Application No. 109489, filed Jun. 25, 2016, which are hereby incorporated by reference as if set forth in their respective entireties herein.

TECHNICAL FIELD

The present subject-matter discloses a laser-assisted encapsulation in which a hermetic seal is formed through melting of an intermediate bonding layer by a laser beam, connecting two substrates to each other.

This technique can be applied to temperature sensitive electronic devices, where the laser-assisted sealing is performed with substrates at room temperature, namely up to 150° C. At least one of the substrates must be transparent at the wavelength of the laser and the bonding material is a low temperature melting paste, mainly composed of glass particles (glass frit), metal particles or composite materials made of glass and metal, or mono- or multi-layer metal films to provide strong adhesion and plasticity to the intermediate bonding layer.

BACKGROUND

Most common bonding techniques for glass, silicon and metal substrates can be divided in two methods: direct bonding and intermediate layer bonding. Direct bonding is obtained by joining two materials without having an intermediate layer between them. This method requires flat, clean and smooth surfaces on the joining materials. The direct bonding can be achieved at elevated annealing temperature during which a chemical bond is achieved between the two materials [1]. In contrast, the method of intermediate layer bonding uses an intermediate layer between two substrates. This intermediate layer can be made of wide range of materials (e.g. metals, polymers, glass frits or composite materials).

Direct bonding can be achieved in both high (ca. 600-1200° C.) and intermediate temperatures (ca. 200° C.-600° C.). The most common example of direct bonding is silicon and glass bonding. This method yields a hermetic and strong bond but the flatness of the surface plays an important role to achieve a high quality seal. The high temperature nature of the direct bonding makes it unsuitable for temperature sensitive devices. In contrast, intermediate temperature direct bonding requires pre-treatment of substrates such as plasma activation or involves ultra-high vacuum (ca. $10^{-10}$ mbar) to decrease the bonding temperature range to 200° C.-400° C. [2]. The major disadvantage of this method is the requirement of expensive and complex technologies in order to achieve a lower temperature sealing.

Another common direct bonding is anodic bonding, which uses high DC voltage at intermediate temperatures. For instance, silicon can be bonded to alkali-containing glasses through applying 400 V-1000 V at a hot plate (300° C.-450° C.). The covalent bond formed through electrochemical reaction of silicon and glass produces a strong and hermetic seal.

Intermediate layer bonding can be categorized into two groups: electrically conductive and insulating interlayers. Common metallic interlayer methods are eutectic and solder bonding. Typically, these methods produce excellent hermeticity with high joint strength at medium to low temperatures but their application is limited to conductive joins due to the nature of the bonding materials. In contrast, insulating interlayer bonding techniques such as glass frit and adhesive bonding are suitable for insulating join applications.

In adhesive bonding, interlayers made of organic or inorganic materials are used for sealing. The adhesive bonding can be used to bond two different materials regardless their coefficient of thermal expansion (CTE) difference. Adhesive bonding is quite cheap compared to other methods and the sealing temperature is low. Nevertheless, adhesive bonding is suitable for applications where hermeticity is not required since the bonding materials are long-term unstable and their bonding strength is relatively low. The most common adhesives used are made of photoresist, polyimide, benzocyclobutene (BCB), and ionomers. [3]

Ultrasonic bonding is a macroscale technique that can produce mechanical joining and fastening of both polymer and metal intermediate layers. This method yields a fast and low temperature bonding with high joint strength. Ultrasonic bonding uses ultrasonic energy and heat for softening of intermediate bonding layer. For the case of metal intermediate layer, the ultrasonic energy causes plastic deformation of metal layers which under compression diffusion of these layers generates the bonding. For example, glass and silicon ultrasonic bonding with indium (In) and gold (Au) can be achieved with bonding pressure of ca. 15 MPa, power of ca. 25 W and vibration amplitude of ca. 1.5 µm. Localized heating of bonding material via ultrasonic energy is the advantage of this method which makes it suitable for temperature sensitive devices [4].

Glass frit bonding is another method of insulating bonding. However, in cases that a conductive join is required, conductive materials can be added to the bonding frit. Glass frits are commonly produced in a form of pastes, which mainly consist of glass powder with grain size of usually less than 15 µm mixed with solvents, binders, and fillers. Depending on the application the CTE of the paste can be tailored to values close to the substrates, through mixing the paste with different additives.

Glass frit bonding has the advantage of compatibility with a wide range of substrate materials (e.g. glass, metal, semiconductors). This method can produce hermetic seals at temperature of ca. 400° C. or higher. The glass frit bonding procedure step includes: (a) deposition of glass frit on the substrate(s), (b) sintering of the frit to remove the additives, and (c) bonding processes.

Screen printing is the most common deposition method of glass frits and the sintering step is typically carried out inside a furnace. The most well-known glass frit bonding process is thermo-compressive, in which two substrates are held under pressure while they are heated to the sealing temperature of the frit. The bonding is formed after a few minutes of holding time at the peak temperature.

There are two parameters that have the most influence on the thermo-compressive bonding: bonding temperature and bonding pressure. For example, if the bonding temperature is less than the sealing temperature, the frit stays solid and no bond is formed. Alternatively, for bonding temperatures higher than the recommended sealing temperature, the glass frit starts to flow on the substrate and the join can have voids since there are some areas free of glass frit. In other cases, when the bonding pressure is not enough, the frit may not wet the other substrate and no bond is formed. Finally, for higher pressures, the frit starts to flow on the substrate, resulting in low quality bonding [5].

In contrast, the glass frit can be locally heated to its melting point via a laser beam. This method of bonding has the benefit of avoiding possible frit flow on the substrate since the joining takes place locally and frit melting only occurs on the spot that the laser is passing. Moreover, this technique can be used to avoid subjecting the entire package to the sealing temperature. However, since the heat from laser beam melts totally or partially the bonding layer, as it thermally contracts during the solidification process eventually cracks or delaminations at the sealing/substrate interface may occur; an external heating source should be added to minimize the differential thermal expansion between the bonding material and the substrates. The process temperature for laser-assisted bonding is commonly retained at minimum temperatures required to avoid thermal shocks on the substrates while laser heats the bonding material. Therefore, the entire device can be held at temperatures lower than the sealing temperature while the laser beam locally heats up the bonding layer to its sealing temperature point. The process temperature highly depends on the composition of the bonding material and its properties. Common process temperature for laser-assisted bonding range from 100° C. to 300° C. [6]. The process temperature maybe be reduced to temperatures lower than 100° C. through using a bonding material with suitable elasticity and low melting temperature.

Hence, laser-assisted bonding can produce a high quality hermetic seal. The lower process temperature of this method expands the intermediate layer bonding technology to a wide range of applications. Moreover, since the process temperature is lower than the thermo-compressive method, the heating/cooling rates are faster, which makes the laser-assisted method more interesting in terms of processing time and costs.

These facts are disclosed in order to illustrate the technical problem addressed by the present disclosure.

General Description

Hermetic encapsulation is required for manufacturing devices that are oxygen and moisture sensitive and also to prevent components of devices from leaking out. Intermediate layer bonding is one the most common techniques used to achieve hermetic encapsulation. The present subject-matter describes a process for sealing these devices, which show an improvement in long-term stability. The disclosed laser-assisted sealing is a technique that uses a laser beam to heat, melt and connect substrates. Since the laser beam aims only at the bonding material line, a few millimetres away from it the temperature remains unchanged. Laser-assisted sealing can be applied for encapsulating a device that includes at least one transparent substrate in the wavelength region of the laser beam.

The most conventional intermediate layer bonding method is thermo-compressive technique in which depending on the characteristics of the bonding material, requires a thermal step of medium to high temperature (commonly higher than ca. 400° C. for achieving long-term hermetic sealing). In thermo-compressive method the bonding is achieved through application of pressure and temperature. During thermo-compressive bonding the entire device should be subjected to a thermal step and the temperature sensitive components of the device may be damaged during this step. Therefore, the application of thermo-compressive sealing is limited to devices that can resist this thermal step.

The present subject-matter discloses a laser-assisted encapsulation in which a hermetic sealing is formed through melting an intermediate bonding layer by a laser beam, connecting two substrates to each other.

This technique can be applied to temperature sensitive electronic devices, where the laser-assisted sealing is performed with substrates at room temperature up to 150° C. At least one of the substrates must be transparent at the wavelength of the laser and the bonding material is a low temperature melting paste, mainly composed of glass particles (glass frit), metal particles or composite materials made of glass and metal, or mono- or multi-layer metal films to provide strong adhesion and plasticity to the intermediate bonding layer.

A preferred but not limiting embodiment of the present disclosure is suitable for Photovoltaic (PV), Organic Light Emitting Diode (OLED) and Microelectromechanical Systems (MEMS) devices.

The encapsulated device may include solid or liquid state components and may consist of several layers of organic and/or inorganic materials.

The hermetically sealed package consists of: (a) a first substrate with or without a conductive film layer on one side; (b) an electrically conductive or nonconductive bonding material; and (c) a second substrate, namely of metal or glass (with or without conducting film), with which the bonding material creates a hermetic seal and bonds the first and second substrates. Alternative materials are possible for one or both substrates: glass, transparent conducting oxide (TCO), metal film coated polymers, etc. The mentioned sealing can be electrically conductive or insulating depending on the composition of the bonding material.

The encapsulating process according to embodiments of the present disclosure includes the following steps: (a) providing the first and second substrates along with the intermediate bonding layer; (b) deposition of the bonding material on the substrate(s) through screen-printing, inkjet-printing or similar methods; (c) if needed, annealing the bonding agent according to its properties; (d) depositing the component(s) of the electrical device on the substrate(s); (e) if needed, sintering the component(s) of the device; (f) placing the substrates together and aligning them so that bonding materials on first and second substrates are in contact; (g) placing the mentioned device on a heating source and heating it to a defined temperature, which depending on the characteristics of the bonding material varies from room temperature to 150° C.; (h) melting the bonding material through directing a laser beam onto it with an optimized conditions for speed, power and particular progressive pattern, to form a hermetic bond between the substrates.

Is its disclosed a laser-assisted encapsulation process comprising: providing the device 100, a laser source 101, the laser beam 102, a first substrate 104, a second substrate 103, active component(s) of the device 105, the intermediate bonding layer 106, optionally a heating source 107, the hermetic sealing 108 formed between first 104 and second substrate 103.

An embodiment of the laser-assisted encapsulation process comprises the steps: providing the first 104 and second substrate 103, being the second substrate 103 is transparent in the emission wavelength of the laser; depositing the intermediate bonding layer 106 on both first 104 and second substrates 103, or only on one of the substrates; If required, sintering the intermediate bonding layer 106 for densification and removal of its additives (i.e. binders and organics) and if necessary taking care that the sintering process, in particular its temperature, does not impair the bonding characteristics of the intermediate bonding layer 106; depositing the component(s) 105 of the electronic device 100 on the substrate(s) (103, 104) and if necessary, sintering them, and if necessary taking care that the sintering process, in particular its temperature, does not impair the bonding characteristics of the intermediate bonding layer 106; placing the first 104 and second substrates 103 together and aligned them so that any intermediate bonding layers 106 on the first 104 and second substrates 104 are in contact; placing the sandwiched device on or in a heating source 107 and heating it to temperatures not higher than the resistance limit of the component(s) 105 of the device; directing the laser beam 102 on the intermediate bonding layer 106 with a predefined progressive scan pattern 200, in a way that the laser beam 102 melts the intermediate bonding layer 106 and forms a hermetic seal 108 that bonds the second substrate 103 to the first substrate 104.

In an embodiment, the intermediate bonding layer 106 is mainly composed of glass particles (glass frit), metal particles or composite materials made of glass and metal, or mono- or multi-layer metal films.

In an embodiment, the sealing width is between 0.2 mm and 5 mm, more preferably between 0.5 mm and 3 mm.

In an embodiment, the spot size of the laser 101 is 500 µm to 2000 µm.

In an embodiment, the thickness of the hermetic sealing 108 is 5 µm to 800 µm, in particular 5 µm to 400 µm.

In an embodiment, the laser-assisted encapsulation process is carried out such that, at approximately 2 mm away from the intermediate bonding material 106, the component(s) 105 of the device are kept at the temperature of the heating source 107.

In an embodiment, the laser source 101 has an emission wavelength between 300 nm to 2500 nm and more preferably between 1.0 µm to 1.2 µm.

In an embodiment, the following parameters of the process are optimized for each given bonding material: (a) speed of the laser scan; (b) power of the laser emission; (c) temperature of the heating source; (e) the number of times that the laser passes a specific location of the intermediate bonding material.

In an embodiment, the temperature of the heating source is equal or less than 150° C.

In an embodiment, the scan pattern 200 is constructed with combination of various shapes such as line, arc, circle, oval, zigzag, sine wave, spiral or any other shapes.

In an embodiment, the movement of each longitudinal laser pass of the laser scan pattern 200 is in the longitudinal direction and as well in the transversal direction of a bonding material 106 strip.

In an embodiment, the number of times that the laser passes a specific location of the intermediate bonding material is in a range of 4 to 50 times, more preferably between 4 and 40 times, and more preferably between 10 and 40 times, even more preferably 15 to 25 times.

In an embodiment, the sealing has a helium leak rate of less than $5 \times 10^{-8}$ atm·cm$^3$·s$^{-1}$.

In an embodiment, the helium leak rate of the sealing is less than $5 \times 10^{-8}$ atm·cm$^3$·s$^{-1}$ after 200 thermal cycle tests according to the IEC 61646 protocol.

In an embodiment, the helium leak rate of the sealing is less than $5 \times 10^{-8}$ atm·cm$^3$·s$^{-1}$ after 50 humidity-freeze cycle tests according to the IEC 61646 protocol.

In an embodiment, the sealing is hermetic.

In an embodiment, the sealing speed is about 5 mm·s$^{-1}$ to 50 mm·s$^{-1}$.

In an embodiment, the laser beam gradually heats up the intermediate bonding material to temperatures higher than its melting point, while keeping the component(s) 105 of the device at the temperature of the heating source 107.

It is disclosed an electronic device encapsulation process, assisted by a laser, for obtaining a sealed electronic device, wherein said process comprises:
  providing a first substrate and a second substrate, the second substrate being transparent in the emission wavelength of the laser,
  depositing an intermediate bonding contour layer on one or both of the substrates;
  depositing electronic device components on one or both of the substrates;
  joining the first substrate and second substrate with the electronic device components in-between the substrates;
  using the laser to direct a laser beam onto the intermediate bonding contour layer with a predefined progressive scan pattern, such that the intermediate bonding contour layer is progressively melted and forms a seal, bonding the substrates together.

In an embodiment, the predefined progressive scan pattern comprises a plurality of successive linear laser passes by the laser beam along the contour of the intermediate bonding contour layer, wherein each linear laser pass overlaps longitudinally the previous and the following linear laser passes along said contour.

In an embodiment, the predefined progressive scan pattern comprises a plurality of successive linear laser passes by the laser beam along the contour of the intermediate bonding contour layer, wherein each linear laser pass is followed by a partial backtrack of the each linear laser pass, such that a part of the linear laser pass overlaps longitudinally the previous linear laser pass.

In an embodiment, the predefined progressive scan pattern comprises, when the width of the contour of the intermediate bonding contour layer is larger than the spot size of the laser beam, each successive linear laser pass is transversally deviated from the previous and the following linear laser passes along said contour.

In an embodiment, the linear laser pass is a rectilinear line or a curved line. In an embodiment, the linear laser pass is a circle line, oval line, zig-zag line, sine wave line, sinusoidal line, spiral line, or combinations thereof.

In an embodiment, the predefined progressive scan pattern comprises the laser passing each transversal location of the intermediate bonding contour layer 4 to 50 times, more preferably 4 to 40 times, more preferably 10 to 40 times, even more preferably of 15 to 25 times.

In an embodiment, the intermediate bonding contour layer has a melting point above 200° C., in particular 200° C.-800° C.

An embodiment comprises, after joining the first substrate and second substrate, and before using the laser, heating the joined substrates to a temperature below the damage limit temperature of the deposited electronic component or components.

An embodiment comprises heating the joined substrates to 150° C. or less.

In an embodiment, the intermediate bonding contour layer comprises glass particles, i.e. glass frit, metal particles, composite materials comprising glass and metal, mono-layer metal films or multi-layer metal films.

In an embodiment, the width of the contour of the intermediate bonding contour layer is between 0.2 mm and 5 mm, more preferably between 0.5 mm and 3 mm.

In an embodiment, the thickness of the seal bonding the substrates is 1 µm to 800 µm, in particular 5 µm to 400 µm.

In an embodiment, the electronic component or components are at a distance of a minimum of 2 mm from the intermediate bonding contour layer.

In an embodiment, the laser has an emission wavelength between 300 nm to 2500 nm and more preferably between 1.0 µm to 1.2 µm.

An embodiment comprises, after depositing the intermediate bonding layer, and before depositing the electronic component or components, sintering the intermediate bonding layer. An embodiment comprises, after depositing the electronic component or components, and before joining the substrates, sintering the electronic component or components.

BRIEF DESCRIPTION OF THE DRAWINGS

For easy understanding of the present disclosure, figures are attached which represent preferred embodiments of the disclosure which, however, do not intend to limit the scope of the present subject-matter.

In FIG. 2 is presented, as a non-limitative example, a cross-sectional view scheme of sealing apparatus and a device. in particular the referred figure shows: laser sealed electronic device 100, laser source 101, laser beam 102, second substrate 103, first substrate 104, component(s) of the device 105, intermediate bonding layer 106, heating source 107, and a hermetic seal 108.

DETAILED DESCRIPTION

The present subject-matter discloses a manufacturing process for hermetically encapsulating electronic devices. Sealing plays an important role in the stability/aging of electronic devices because it ensures the device's inner component(s) are isolated from external contaminants and avoids the loss of active chemical(s). The ideal sealing material should be: i) stable at working conditions; ii) inert to all the chemical components of the device; iii) impermeable to the substances of the device and to environmental oxygen and humidity, as well as to other atmospheric contaminants; iv) low-cost; vi) applied in a way that does not influence the device functioning and; vii) of properties such to allow fast sealing velocities.

Figure 1:
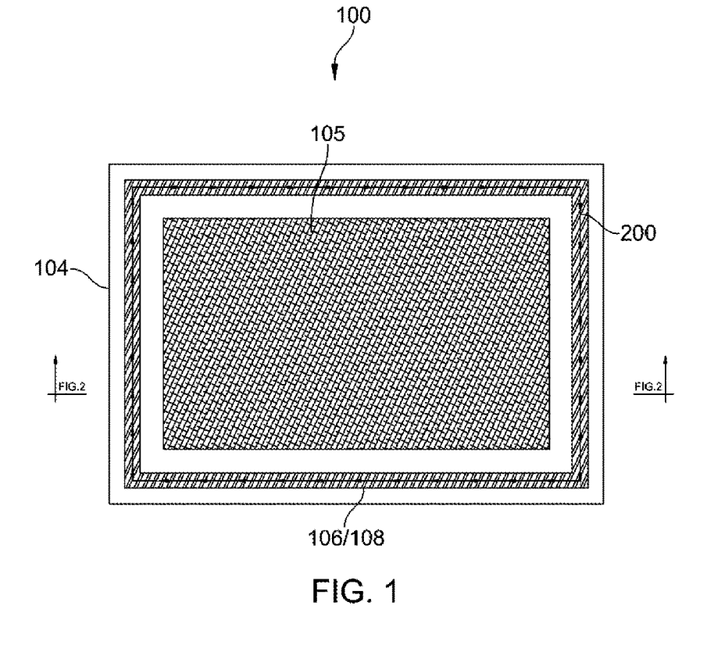
In FIG. 1 is presented, as a non-limitative example, a top view scheme of a laser sealed device according to the present disclosure. In particular the referred figure shows: laser sealed electronic device 100, first substrate 104, component(s) of the device 105, intermediate bonding layer 106, hermetic seal 108, and a laser scan pattern 200.
Figure 2:
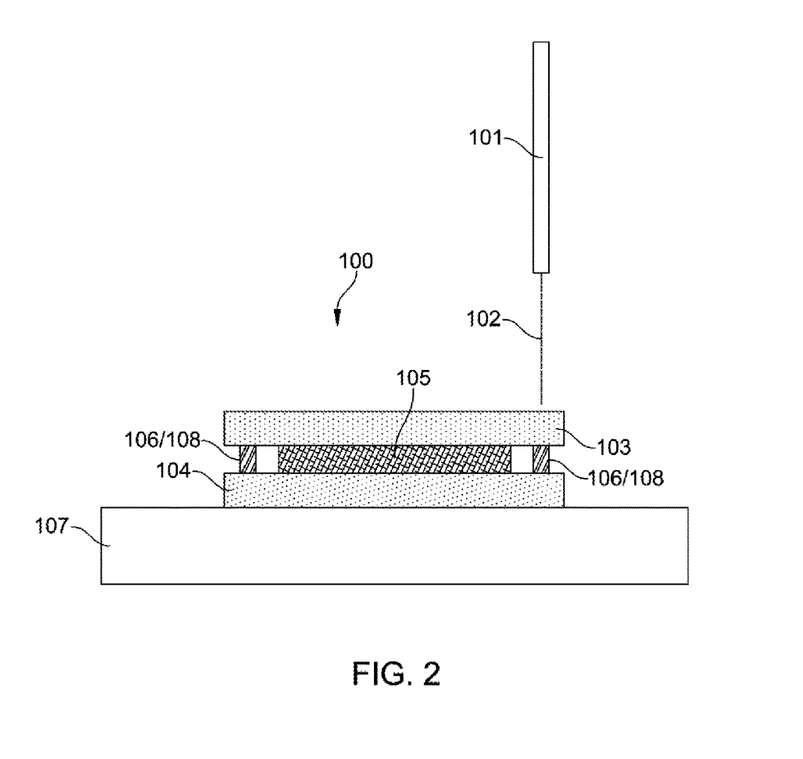

The sealed device 100 comprises of a first substrate 104, which can be opaque (e.g. glass, metallic substrate), component(s) of the device 105, an intermediate bonding layer 106, which has a sealing point range of 200° C. to 800° C., and a second substrate 103, which must be transparent (e.g. glass) at the wavelength of the laser source. The intermediate bonding layer 106 is locally heated to its melting point using a laser beam 102 and as a result a hermetic seal 108 is formed between first and second substrates. The heating source 107 is needed for avoiding thermal shock when the laser beam heats the substrates during the sealing process.

Figure 3:
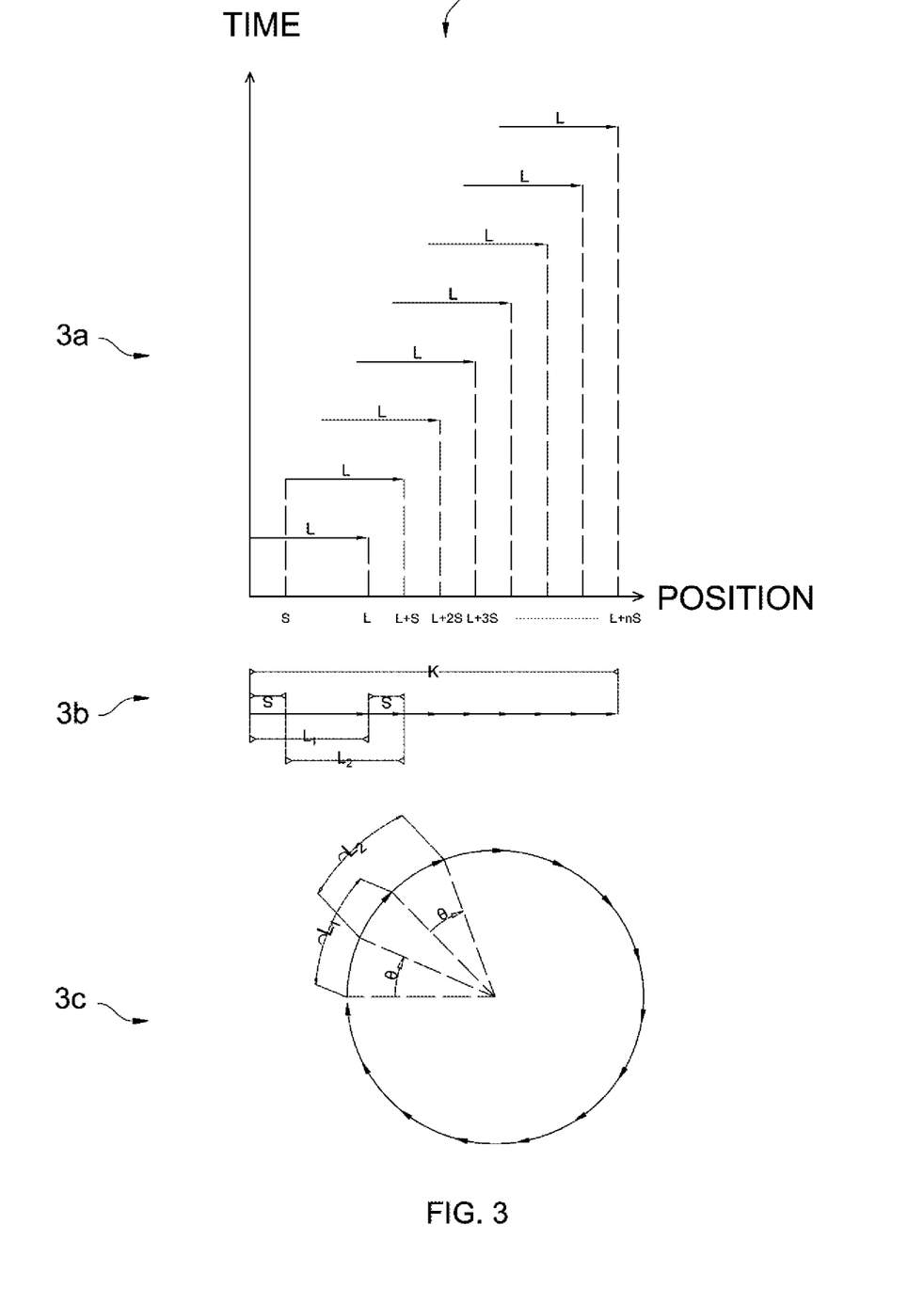
In FIG. 3 is presented, as a non-limitative example, a position vs time of the scan pattern 200 (3a), a laser scan pattern for line (3b) and arc sealing (3c) shape designs. In particular the referred figure shows a laser scan pattern 200.

The present subject-matter considers a laser scan pattern 200 with a progressive line/arc configuration in which the laser passes a given point several times, gradually heating up the bonding material 106 to its melting point—FIG. 3. Independently of the sealing design, preferably it should define a closed volume where the device components(s) are confined; the overall shape of the design preferably consists of lines and arcs, or can be mapped correspondingly to lines or arcs. The laser scan pattern 200 comprises several lines with length "L" and each line proceeds to the next one by step length "S"—FIG. 3b. In the case of arcs, the scan pattern 200 is made of arc lengths "L" and step angle "θ°"—FIG. 3c. The ratio between "L" and "S" indicates the number of times "P" that the laser passes through a given point:

$$P = \frac{L}{S}$$

FIG. 3a shows position vs time of the scan pattern 200 in which the length of the lines "L" is approximately four times larger than the step size "S" resulting in four times "P" of the laser passing a given point.

In an embodiment of the present subject-matter the number of times "P" that the laser passes a specific location of the intermediate bonding layer 106 can be greater than or equal to four and less than or equal to forty. However, optimization of "L" and "S" is preferably necessary for each bonding material.

$$4 \leq P = \frac{L}{S} \leq 40$$

The advantage of the scan pattern 200 according to the present disclosure is that the bonding material is gradually heated up to its melting point rather than suddenly flash heated, which may lead to high stress on the substrate (e.g. cracks on glass substrates). Referring to FIG. 3b a line with length "K" is composed of eight lines with length "L" and step size of "S" in which the sub-lines "L" are moving with relatively high speed. Therefore, when observing with naked eyes the pattern looks completely continuous. FIG. 3c is the scan pattern for rounded shapes that can be used as a whole circle or as an arc in more complex shaped designs. In fact, the disclosure is straightforwardly adaptable to any linear contour.

Figure 4:
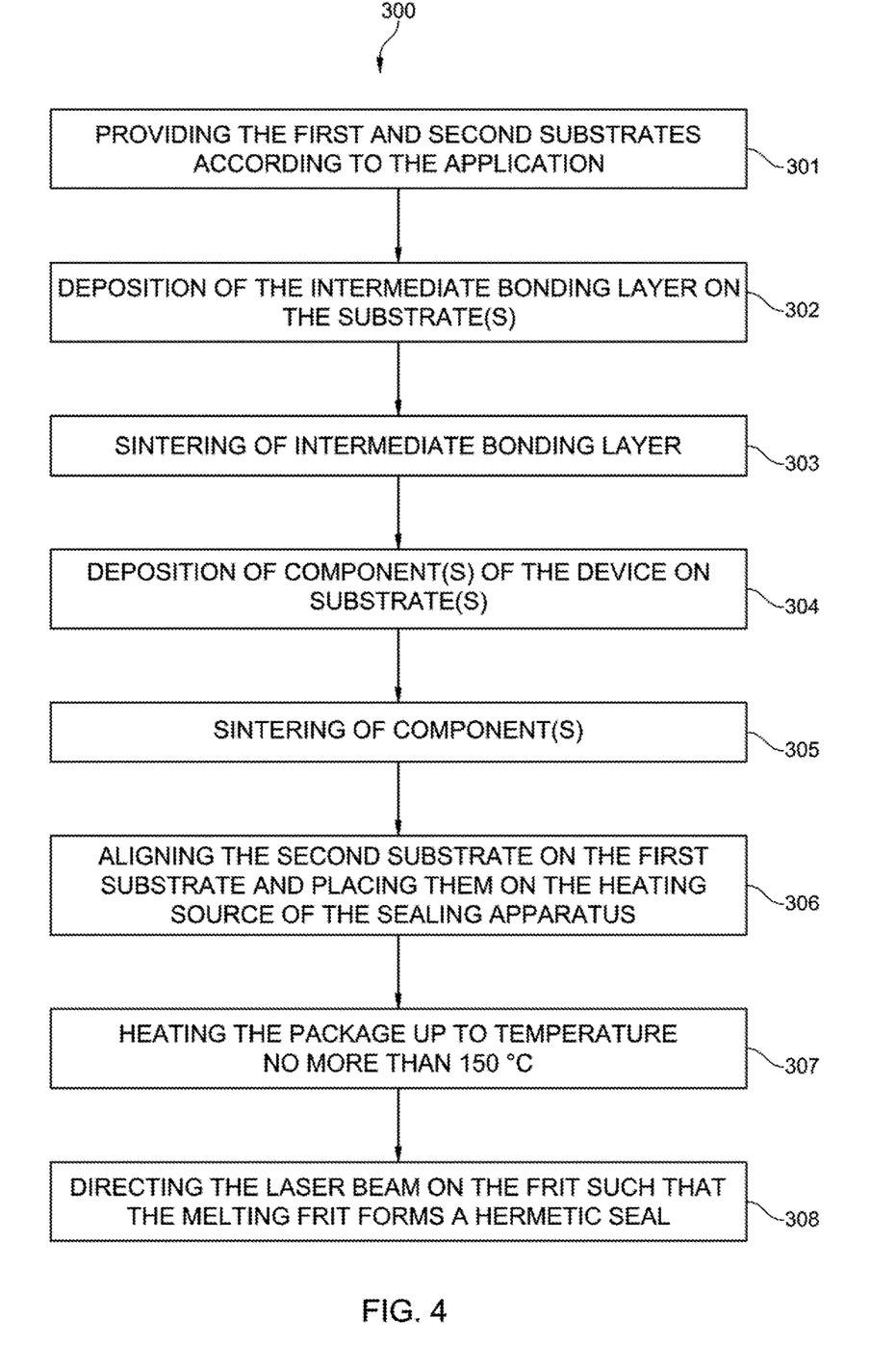
In FIG. 4 is presented, as a non-limitative example, a flowchart showing all the required steps for laser sealing a device in accordance with the present disclosure.

The present disclosure considers the following steps for laser sealing a device 100—FIG. 4. Step 301 is to provide the substrates according to the specific application. In particular, the substrate 103 has to be transparent (i.e. glass or composite materials) in the wavelength range of the laser beam 102. However, the choice for substrate 104 can be of a diverse range of materials such as glass, metal or composite materials. Depending on the application of the device, the first 104 and/or second 103 substrates can be coated with a transparent conducting oxide (TCO) or other conductive film to direct the electrical charge generated or utilised inside the sealing area to or from the outside region of the substrate.

An embodiment of the present disclosure describes the use of both substrates 104 and 103 made of soda-lime glass which are coated with a TCO such as fluorine doped tin oxide (FTO), indium tin oxide (ITO), aluminium doped zinc oxide (AZO), or titanium doped zinc oxide (TZO).

Another embodiment of the present disclosure describes the use of substrate 103 made of soda-lime glass which is coated with a TCO such as fluorine doped tin oxide (FTO), indium tin oxide (ITO), aluminium doped zinc oxide (AZO), or titanium doped zinc oxide (TZO), and the substrate 104 made of soda-lime glass.

Next, step 302 considers the deposition of the intermediate bonding layer 106 on the substrate(s) through screen-printing, doctor-blading, dispensing, spin-coating, inkjet-printing, physical vapour deposition, chemical vapour deposition or other similar deposition methods.

A preferred but not limiting embodiment of the present disclosure considers an intermediate bonding layer 106 that is a mainly made of glass materials, which may be mixed with other substances to provide electrical conductivity, plasticity, adhesion to substrates and/or CTE match, or any combination thereof.

The melting point of the intermediate bonding layer 106 should preferably be in the range of 200° C. to 800° C. and it can be ground (e.g. by ball mill) before deposition.

The thickness of the sealing 108 can be increased through deposition of several layers of bonding material on substrate(s). For example, the lowest sealing 108 thickness can be achieved by screen-printing the intermediate bonding material 106 on only one of the substrates.

Step 303 considers an optional step—sintering of the bonding material 106—that depends mainly on the nature of it. A sintering process is a thermal treatment which consists of three major steps: (a) drying and solvent removal; (b) organic binder burn out; and (c) glazing. The sintering step can be also used to reduce the final thickness of the seal 108.

A preferred embodiment of the present subject-matter considers the sintering of the bonding material 106 deposited on a substrate by placing the substrate inside a furnace and heating it according to its recommended sintering conditions.

Although the laser sealing process could be applied to non-sintered bonding materials, better results may be reached with sintered pastes. This sintering process can be carried out in a static or belt furnace with/without gas feeds, in a blow-dryer with forced air circulation or similar methods.

At step 304, the active component(s) 105 of the electronic device 100 is/are deposited on the substrate(s). These component(s) can be deposited by various deposition techniques such as spin coating, sol-gel, screen-printing, ink-jet printing, dispensing, spray-pyrolysis, atomic layer deposition (ALD), sputtering, chemical vapour deposition, thermal evaporation, drop-casting, dip-coating, or similar methods, or a combination of these techniques. The component(s) 105 should preferably be deposited at ca. 0.5-5 mm away from the intermediate bonding layer perimeter to keep them away from the conducted heating of the laser sealing process.

Step 305 considers another optional step—sintering of the active component(s) 105—depending on the electronic device nature. In some applications the deposited materials have to be sintered to be free from binders and solvents. This thermal conditioning step can similarly be done in a furnace, blow-dryer, or similar equipment.

A preferred embodiment of the present disclosure considers the case of manufacturing an electrical device that contains some components that may require a sintering step for removal of solvents and binders.

Step 306 describes the alignment of the second substrate 103 on the first substrate 104 and placement of the device on or in the heating source 107 of the sealing apparatus in a way that the first substrate 104 is on top of the heating source and the laser beam 102 is radiated through the second substrate 103.

The sealing apparatus is composed of two main elements: the laser 101, and controlled heating source 107. The laser 101 can be of any type of laser having emission wavelength range for example between 300 nm to 2000 nm. The controlled heating source 107 is used to minimize the induced stress on the substrates during the sealing process (leading to, e.g., cracks on glass plates).

At step 307, the heating source 107 is used to heat up the device with controlled heating rate. The set point temperature of the heating source 107 should preferably not exceed a temperature higher than the limit of resistance of the heat sensitive component(s) 105 of the device.

A preferred embodiment of the present disclosure describes the use of devices sensitive to temperatures higher than 70° C.-150° C. therefore, the device 100 should be submitted to temperatures not higher than 150° C. from the heating source.

A preferred embodiment of the present subject-matter considers the use of an appropriate intermediate bonding layer for sealing at room temperature, thus dispensing with step 307.

An alternative embodiment of the present subject-matter considers that the heating source may be removed and the pre-heating step of the sealing process can be achieved by means of another laser beam, which can assist the sealing process by heating and cooling the bonding material at a rate that the substrates do not become damaged.

Final step 308 concerns laser sealing the device package 100 by directing the laser beam 102 on the intermediate bonding material 106, such that the bonding material melts and forms a hermetic seal 108 joining the first substrate 104 to the second substrate 103. The laser source 101 can be moved by a robot arm or gantry to direct the laser beam 102 on the sealing design, or it can be fixed and utilise galvanometer laser scanning mirror based beam optics for sealing of small dimensioned sealing shapes, or a combination of both.

A preferred embodiment of the present disclosure considers the sealing process being carried out in an inert atmosphere whenever the component(s) 105 of the device are sensitive to air.

Example 1

The disclosed sealing process should be evaluated by means of helium leak rate testing of the laser sealed packages according to method 1014.13, A1 test condition of the MIL-STD-883H standard for microcircuits [7]. The test consists of two steps: pressurizing (bombing) and leak detecting. The pressurizing (bombing) step is carried out inside "chamber 1", where the sealed package should be pressurized under helium gas up to a maximum pressure of 75 psi for a minimum dwell time of 2 h. During the pressurization, the pressure difference would allow helium to permeate inside the internal volume of the package. After this pressurization period of time, "chamber 1" is depressurized and the sample transferred to "chamber 2", which is evacuated. During this step, the potentially trapped helium inside the sealed package would permeate back out through the bonding material and would be detected by the mass spectrometer that is connected to "chamber 2". The reject limit of the test is $5 \times 10^{-8}$ atm·cm$^3$·s$^{-1}$.

Figure 5:
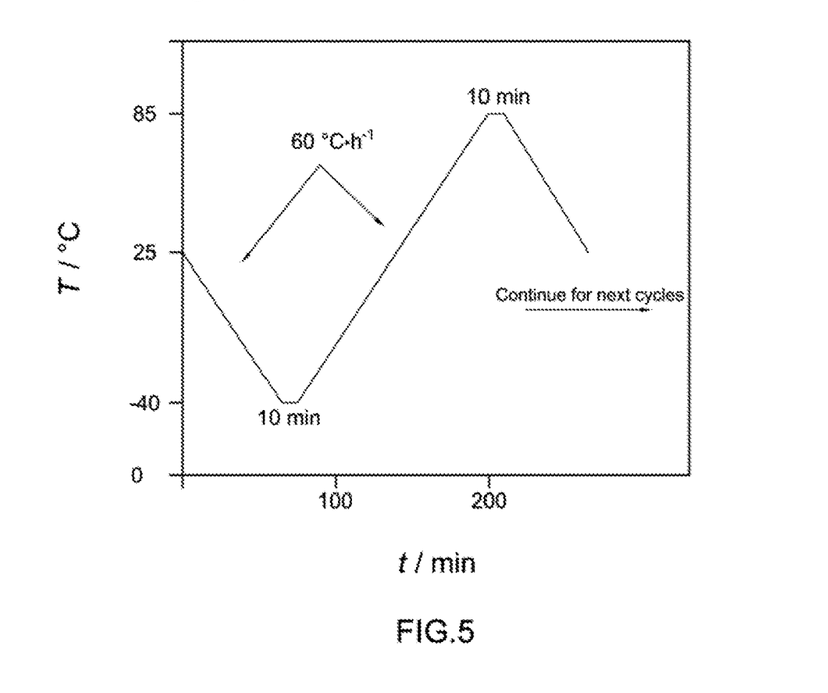
In FIGS. 5-9 are presented, as a non-limitative example, images and graphs showing the results and experiments used to examine the quality of the sealing according to the present disclosure. In particular the referred figures show: laser sealed electronic device 100, second substrate 103, first substrate 104, component(s) of the device 105, intermediate bonding layer 106, and a hermetic seal 108.
Figure 6:
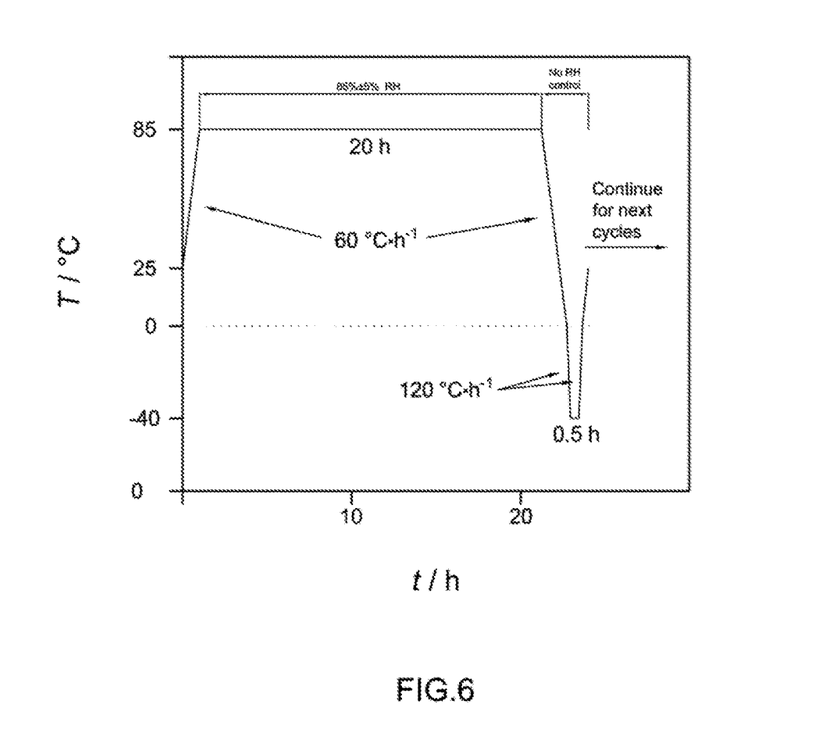
Figure 7:
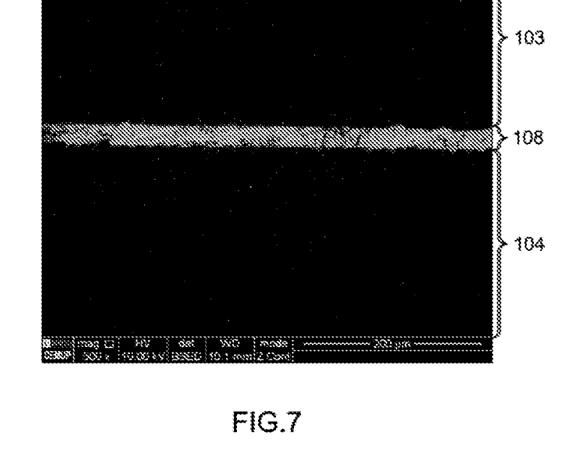
Figure 8:
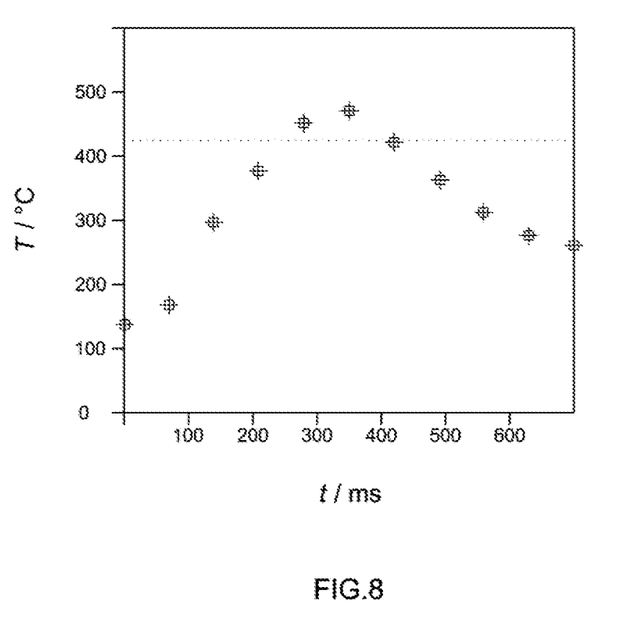
Figure 10:
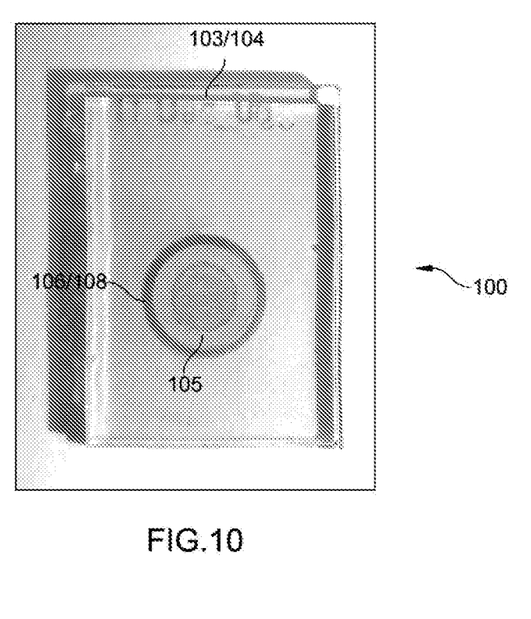
In FIG. 10 is presented a photo of a preferred embodiment of the present disclosure comprising a laser-sealed device made of two soda-lime glass substrates.

The disclosed sealing process should be evaluated by means of temperature and relative humidity profiles for thermal cycling—FIG. 5—and humidity-freeze tests—FIG. 6—according to IEC 61646 standard for "Thin-film terrestrial photovoltaic (PV) modules—Design qualification and type approval" [8]. A preferred embodiment of the present disclosure was tested through the temperature profile of thermal cycling testing according to method 10.11 of IEC 61646 standard—FIG. 5. The higher temperature of the cycle is 85° C. and the cold temperature is at −40° C. The temperature change rate is 1° C.·min$^{-1}$ and the dwell time at each set point is 10 minutes. During the thermal cycle test there is no control on the relative humidity. A preferred embodiment of the present disclosure was tested through the temperature and relative humidity profile of humidity-freeze testing according to method 10.12 of IEC 61646 standard which takes place inside a climatic chamber—FIG. 6. The temperature change rate for sub-zero conditions are set to 0.5° C.·min$^{-1}$ while the temperature change rate for the rest of the cycle is 1° C.·min$^{-1}$. The dwell time at 85° C. is 20 hours while the dwell time at −40° C. is 30 minutes. The relative humidity (RH %) is set to 85% during the 20 hours at 85° C. while there is no control on the relative humidity during the rest of the cycle. A preferred embodiment of the present disclosure was analysed by scanning electron microscopy (SEM). A cross-sectional image of the sealing according to the present innovation is presented—FIG. 7. Substrates 103 and 104 are made of soda-lime glass, intermediate bonding layer 106 is a mixture of glass with metals, and the temperature on the heating source during laser sealing was 120° C. A preferred embodiment of the present disclosure considers substrates 103 and 104 are made of soda-lime glass, and intermediate bonding layer 106 is a mixture of glass with metals. A laser emission wavelength range of 1 µm to 1.2 µm, power range of 40 W to 50 W, number of times "P" that the laser passes through a given point of 10 to 40 and heating source temperature of 120° C. which forms a hermetic seal 108 and joins the substrates. The helium leak rate of the hermetic seal 108 is less than $5 \times 10^{-8}$ atm·cm$^3$·s$^{-1}$ after thermal cycle and humidity-freeze tests. The temperature profile of the intermediate bonding layer 106 in a preferred embodiment of the present disclosure during the laser sealing is presented—FIG. 8. The dotted line indicates the sealing point of the intermediate bonding layer. The intermediate bonding layer is gradually heating up to its sealing temperature and forms a hermetic seal between the substrates. A photo of a preferred embodiment of the present disclosure comprising a laser-sealed device made of two soda-lime glass substrates is presented—FIG. 10.

Example 2

Perovskite solar cells are one of the most promising new photovoltaic technologies. However, these devices are known to be highly sensitive to air and humidity. Therefore, a hermetic package must be used keep these devices stable for long-term conditions required for commercial applications. These photovoltaic devices are commonly constructed through sequential deposition of several layers of organic/inorganic materials. For example, materials such as metal oxides, gold (Au), silver (Ag), graphene (C), fluorine doped tin oxide (FTO), perovskite, hole transport material (HTM), can be found as components 105 to be encapsulated. To date, the most common perovskite materials used for photovoltaic purposes are organometal halides (e.g. methylammonium lead triiodide). As HTM component of the device, 2,2',7,7'-tetrakis(N,N-dimethoxyphenylamine)-9,9'-spirobifluorene (spiro-OMeTAD) is the most frequently used material. This example shows an embodiment where the first substrate 104 is made of soda-lime glass coated with FTO and the second substrate 103 is made of soda-lime glass. The intermediate bonding layer 106 is a metal-glass paste with sealing temperature of 420° C. The components 105 of the device are $TiO_2$ blocking layer, $TiO_2$, $CH_3NH_3PbI_3$ and spiro-OMeTAD deposited by spin-coating and gold by thermal evaporation. The wavelength of the laser 101 is in the range of 1000 nm to 1200 nm and the temperature on heating source 107 is in the range of 25° C. to 60° C.

Example 3

The thermodynamic efficiency of a single-junction solar cell is limited to ca. 34%. However, several single-junction cells can be stacked together to construct multi-junction solar cells. Every different single-junction cell can produce electric current from light in a specific range of wavelength. Therefore, building multi-junction solar cells a broader range of wavelengths can be captured which results in higher efficiency. Common perovskite materials (e.g. $CH_3NH_3Pb(Br_xI_{1-x})$) are known to have a tunable bandgap that makes them suitable for making multi-junction solar cells.

This example shows an embodiment where the first substrate 104 and the second substrate 103 are made of glass, metal or metalloid. The intermediate bonding layer 106 is a metal-glass paste with sealing temperature of 420° C. The device is a multi-junction solar cell with various components 105 depending on the different single-junction cells. A preferred but not limited embodiment example of a multi-junction solar includes single-junction cells such as perovskite solar cells that are sensitive to humidity and high temperature. The wavelength of the laser 101 is in the range of 1000 nm to 1200 nm and the temperature of the heating source 107 is in the range of 25° C. to 60° C.

Example 4

This example shows an embodiment where the second substrate 103 is made of glass. The intermediate bonding layer 106 is made of mono- or multi-layer metal film deposited through PVD, electrodeposition, screen-printing, evaporation, inkjet-printing or similar methods. The thickness of intermediate bonding layer 106 can be adjusted depending on the thickness of the components 105 of the device. For example, the intermediate bonding layer 106 could be made of a single metal layer or sequential deposited layers of various metals. The preferred metals are ones that have CTE close to the first and second substrates as well as having strong adhesion to the substrates. The wavelength of the laser 101 is in the range of 1000 nm to 1200 nm and the temperature of the heating source 107 is in the range of 25° C. to 120° C.

Example 5

Figure 9:
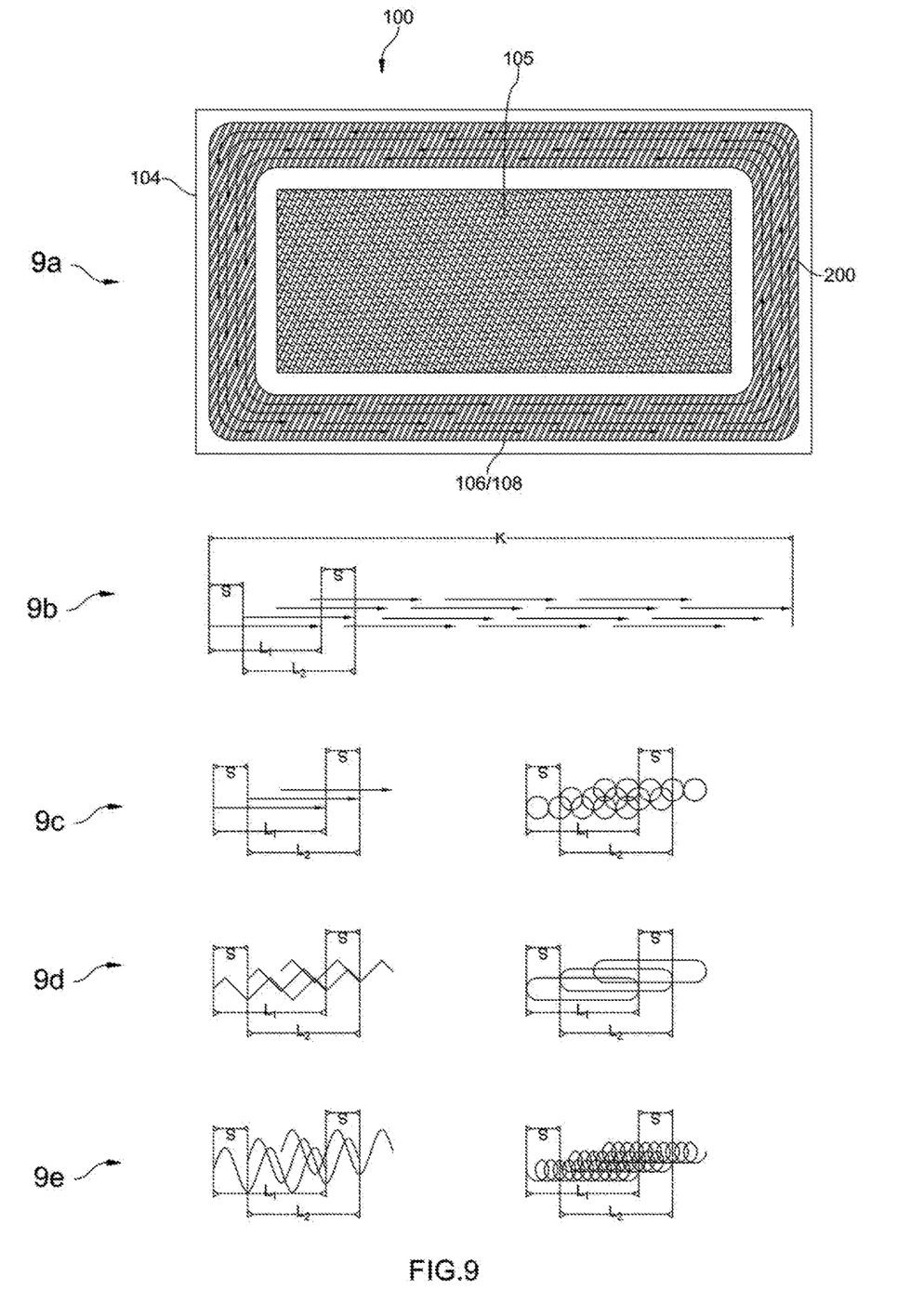

This example describes an embodiment where the laser scan pattern 200 sweeps the axial and lateral positions of the bonding line 106, covering in this way the whole bonding line upper surface (see for example FIG. 9a). In this progressive line/arc configuration the laser passes not only in the forward axial direction but also sweeps the lateral direction of the bonding material 106 in subsequent passes to ensure bonding of the entire seal line—FIG. 9. This method can be used to minimize thermal stress on the bonding layer 106, where there is a rapid temperature change. Another application of this method is when the width of the bonding layer 106 is larger than the spot size of the laser. For example, when the width of bonding layer 106 is "n" times larger than the spot size of the laser, the laser scan pattern 200 distributes to "n" lines/arcs to uniformly heat up the bonding layer 106 to its bonding temperature. FIGS. 9a and 9b show the application of this method for a laser spot size 4 times smaller than the width of the bonding material 106.

FIGS. 9c-9e show that the application of each pass of the laser sealing pattern is not limited to the use of lines. Therefore, other shapes (e.g. circles, ovals, zigzags, waves, spirals, etc.) can be used to construct the pattern. However, in all cases the ratio between "L" and "s" determines the number of times "P" that the laser passes a given point.

The term "comprising" whenever used in this document is intended to indicate the presence of stated features, integers, steps, components, but not to preclude the presence or addition of one or more other features, integers, steps, components or groups thereof. The invention should not be seen in any way restricted to the embodiments described and a person with ordinary skill in the art will foresee many possibilities to modifications thereof. The above described embodiments are combinable. The following claims further set out particular embodiments of the disclosure. The following references, should be considered herewith incorporated in their entirety:

[1] H. Kuisma, Chapter Thirty—Introduction to Encapsulation of MEMS, in: V. Lindroos, M. Tilli, A. Lehto, T. Motooka (Eds.), Handbook of Silicon Based MEMS Materials and Technologies, William Andrew Publishing, Boston, 2010, pp. 501-504.

[2] K. Henttinena, T. Sunib, Chapter Thirty One—Silicon Direct Bonding, in: V. Lindroos, M. Tilli, A. Lehto, T. Motooka (Eds.), Handbook of Silicon Based MEMS Materials and Technologies, William Andrew Publishing, Boston, 2010, pp. 505-512.

[3] C. T. Pan, P. J. Cheng, M. F. Chen, C. K. Yen, Intermediate wafer level bonding and interface behavior, Microelectronics Reliability 45 (2005) 657-663.

[4] J. Kim, B. Jeong, M. Chiao, L. Lin, Ultrasonic Bonding for MEMS Sealing and Packaging, IEEE Transactions on Advanced Packaging 32 (2009) 461-467.

[5] R. Knechtel, Chapter Thirty Three—Glass Frit Bonding, in: V. Lindroos, M. Tilli, A. Lehto, T. Motooka (Eds.), Handbook of Silicon Based MEMS Materials and Technologies, William Andrew Publishing, Boston, 2010, pp. 521-531.

[6] A. M. M. Mendes, L. M. M. Andrade, J. G. M. Mendes, J. M. L. M. Nogueira, F. M. Da Silva Ribeiro, Substrate and electrode for solar cells and the corresponding manufacturing process, Google Patents, 2014.

[7] MIL-STD-883H, Test method standard microcircuits, 2010.

[8] IEC61646, Thin-film terretrial photovoltaic (PV) modules—Design qualification and type approval, 2008.

The invention claimed is:

1. An electronic device encapsulation process, assisted by a laser, for obtaining a sealed electronic device, comprising:
providing a first substrate and a second substrate, the second substrate being transparent in the emission wavelength of the laser,
depositing an intermediate bonding contour layer on one or both of the substrates;
depositing electronic device components on one or both of the substrates;
joining the first substrate and second substrate with the electronic device components in-between the substrates; and
progressively melting, using the laser to direct a laser beam onto the intermediate bonding contour layer with a predefined progressive scan pattern, the intermediate bonding contour layer to form a seal and thereby bond the substrates together;
the process further comprising, after depositing the intermediate bonding layer, and before depositing the electronic component or components, sintering the intermediate bonding layer;
the process further comprising, after depositing the electronic component or components, and before joining the substrates, sintering the electronic device components, wherein the predefined progressive scan pattern comprises a plurality of successive linear laser passes by the laser beam along a contour of the intermediate bonding contour layer,
wherein each linear laser pass either (i) overlaps longitudinally the previous and the following linear laser passes along said contour, or (ii) is followed by a partial backtrack of the each linear laser pass, such that a part of the linear laser pass overlaps longitudinally the previous linear laser pass,
wherein a width of the contour of the intermediate bonding contour layer is larger than the spot size of the laser beam,
wherein the predefined progressive scan pattern comprises, each successive linear laser pass is transversally deviated from the previous and the following linear laser passes along said contour.

2. The electronic device encapsulation process according to claim 1, wherein the predefined progressive scan pattern comprises a plurality of successive linear laser passes by the laser beam along a contour of the intermediate bonding contour layer, wherein each linear laser pass overlaps longitudinally the previous and the following linear laser passes along said contour.

3. The electronic device encapsulation process according to claim 1, wherein the predefined progressive scan pattern comprises a plurality of successive linear laser passes by the laser beam along a contour of the intermediate bonding contour layer, wherein each linear laser pass is followed by a partial backtrack of the each linear laser pass, such that a part of the linear laser pass overlaps longitudinally the previous linear laser pass.

4. The electronic device encapsulation process according to claim 1, wherein the linear laser pass is a rectilinear line or a curved line.

5. The electronic device encapsulation process according to claim 1, wherein the linear laser pass is a circle line, oval line, zig-zag line, sine wave line, sinusoidal line, spiral line, or combinations thereof.

6. The electronic device encapsulation process according to claim 1, wherein the predefined progressive scan pattern comprises the laser passing each transversal location of the intermediate bonding contour layer 4 to 50 times.

7. The electronic device encapsulation process according to claim 1, wherein the intermediate bonding contour layer has a melting point above 200° C.

8. The electronic device encapsulation process according to claim 1, further comprising, after joining the first substrate and second substrate, and before using the laser, heating the joined substrates to a temperature below the damage limit temperature of the deposited electronic component or components.

9. The electronic device encapsulation process according to claim 8, further comprising heating the joined substrates to 150° C. or less.

10. The electronic device encapsulation process according to claim 1, wherein the intermediate bonding contour layer comprises glass particles, metal particles, composite materials comprising glass and metal, mono-layer metal films or multi-layer metal films.

11. The electronic device encapsulation process according to claim 1, wherein the width of the contour of the intermediate bonding contour layer is between 0.2 mm and 5 mm.

12. The electronic device encapsulation process according to claim 1, wherein the thickness of the seal bonding the substrates is 1 μm to 800 μm.

13. The electronic device encapsulation process according to claim 1, wherein the electronic component or components are at a distance of a minimum of 2 mm from the intermediate bonding contour layer.

14. The electronic device encapsulation process according to claim 1, wherein the laser has an emission wavelength between 300 nm to 2500 nm.

15. The electronic device encapsulation process according to claim 1, wherein the encapsulation has a helium leak rate of less than $5\times10^{-8}$ atm·cm$^3$·s$^{-1}$.

16. The electronic device encapsulation process according to claim 15, wherein the encapsulation has the helium leak rate of less than $5\times10^{-8}$ atm·cm$^3$·s$^{-1}$ after 200 thermal cycle tests.

17. The electronic device encapsulation process according to claim 15, wherein the encapsulation has the helium leak rate of less than $5\times10^{-8}$ atm·cm$^3$·s$^{-1}$ after 50 humidity-freeze cycle tests.

18. A product obtained by the process of claim 1.

* * * * *